United States Patent [19]

Fosnough

[11] 3,896,544

[45] July 29, 1975

[54] METHOD OF MAKING RESILIENT ELECTRICAL CONTACT ASSEMBLY FOR SEMICONDUCTOR DEVICES

[75] Inventor: Robert D. Fosnough, Logansport, Ind.

[73] Assignee: Essex International, Inc., Fort Wayne, Ind.

[22] Filed: Feb. 4, 1974

[21] Appl. No.: 439,366

Related U.S. Application Data

[62] Division of Ser. No. 323,991, Jan. 15, 1973, abandoned.

[52] U.S. Cl. .................... 29/588; 29/589; 29/627; 357/79

[51] Int. Cl.$^2$ .................... B01J 17/00

[58] Field of Search .......... 29/588, 587, 627, 589; 357/79

[56] References Cited

UNITED STATES PATENTS

| | | | |
|---|---|---|---|
| 2,809,332 | 10/1957 | Sherwood | 317/235 |
| 2,943,359 | 7/1960 | Sussman | 29/588 |
| 3,030,558 | 4/1962 | Berg | 29/588 |
| 3,396,316 | 8/1968 | Wislocky | 317/234 |
| 3,721,868 | 3/1973 | Smith | 317/234 |

FOREIGN PATENTS OR APPLICATIONS

| | | | |
|---|---|---|---|
| 804,799 | 1/1969 | Canada | 317/234 |

*Primary Examiner*—W. Tupman
*Attorney, Agent, or Firm*—Robert D. Sommer; Lawrence E. Freiburger

[57] ABSTRACT

A semiconductor assembly employing a resilient material having electrically conductive particles dispersed throughout in intimate electrical and thermal contact with a semiconductor chip. Pressure is applied to the resilient material to hold the semiconductor chip in place and to maintain good electrical and thermal contact to the chip. Electrical and thermal connections are made from semiconductor chip to the outside of a case member by electrical contact members which electrically contact the resilient material.

4 Claims, 3 Drawing Figures

METHOD OF MAKING RESILIENT ELECTRICAL CONTACT ASSEMBLY FOR SEMICONDUCTOR DEVICES

This is a division of application Ser. No. 323,991 filed Jan. 15, 1973, now abandoned.

BACKGROUND OF THE INVENTION

This invention pertains to semiconductor devices and also to a method for making these devices.

Conventional stud-mounted semiconductor devices have been widely used in the past because of their good heat sinking properties. These devices are presently assembled using complex manufacturing processes and material of very exact electrical and thermal characteristics. For example, in the prior art in making a simple diode it was necessary to attach a layer of solder to each side of a PN junction. Then, a molybdenum disk was attached to the anode solder layer with another layer of solder attached on the opposite side of the disk which made electrical and thermal contact to the threaded stud. Either soft or hard solder has been used in the past, but both present drawbacks. If soft solder is used, thermal fatigue or strains occur in the softsoldered joints resulting in a reduction of the effective life span of the device. If hard solder is used, the high soldering temperature deleteriously affects the performance of the device.

SUMMARY OF THE INVENTION

In accordance with the teachings of this invention, there is provided a semiconductor assembly in which a resilient material containing electrically conductive particles dispersed throughout makes contact to the semiconductor chip. In the case of a diode, the PN junction is sandwiched between two pads of the resilient material. As a result, any expansion of the chip is absorbed by the resilient material. This results in reduced thermal stresses as well as reducing mechanical stresses accompanying such thermal stresses. The end effect is a diode with an increased lifetime and performance which is limited only by the quality of the semiconductor wafer.

The method by which this invention can be assembled is a simple, inexpensive method relative to prior art inventions. By way of example, if the semiconductor is a diode, the PN junction is sandwiched between two pads of the resilient material. Contact to a circuit is made through a conventional diode housing having a case with a threaded stud and a cap through which contact to the cathode is made and pressure maintained on the semiconductor sandwich.

It is evident to one skilled in the art that the above method for assembling a semiconductor device overcomes many of the problems encountered in the prior art. It is no longer necessary to select contact materials having exact thermal characteristics. The resiliency of the material will allow the semiconductor chip to expand in a direction normal to the wafer surface as well as laterally.

BRIEF DESCRIPTION OF THE DRAWINGS

Hereafter, reference will be made to the drawings in which.

DESCRIPTION OF THE PREFERRED EMBODIMENTS

Figure 1:
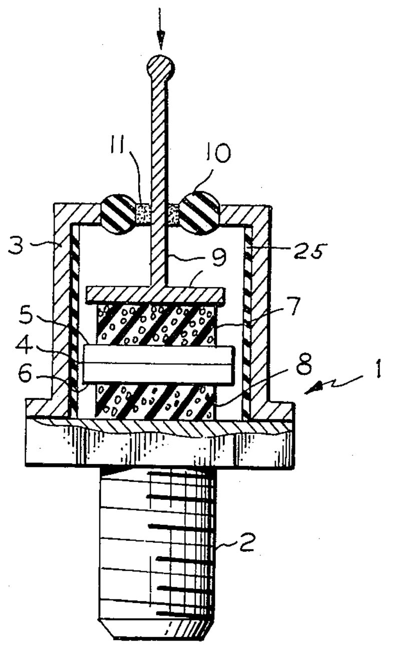
FIG. 1 is an elevation view, partly in cross section, of one embodiment of this invention.

A diode constructed according to the teachings of this invention is shown in FIG. 1 and is generally indicated by reference character 1. A conventional diode housing is shown with a case having a threaded stud 2 and a cap 3. A PN semiconductor junction 4, having cathode 5 and anode 6, is shown disposed between two identical resilient pads 7 and 8 respectively. Pad 8 makes electrical and thermal contact from the anode 6 to the threaded stud 2 of the diode housing. Pad 7 makes contact from the cathode 5 to an external circuit contact 9. Contact 9 is insulated from the cap 3 by a ring of insulating material 10 and is held in place by a layer of suitable holding cement 11, such as soft solder.

A ceramic tube 25 may be used to line the cap 3 to insulate the PN semiconductor wafer 4, the resilient pads 7 and 8 and the contact 9 from the cap 3.

Figure 2:
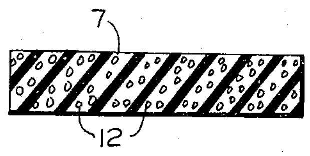
FIG. 2 is an enlarged cross section of a sub-assembly shown in FIG. 1.

In FIG. 2 is shown an enlarged view of the resilient pad 7. This pad is a composite body formed of a synthetic, inorganic, resilient, non-conductive substance such as silicone rubber and throughout which is dispersed a quantity of discrete, electrically conductive, metallic particles. The dispersion of the particles is such that when the pad is in its normal unstressed condition, the electrical resistance of the pad is infinite and the pad is non-conductive. When the pad is subjected to a compressive force of sufficient magnitude, however, the particles are forced to move relative to one another into particle-to-particle engagement. The resistance of the pad changes to that of the metal particles and becomes electrically conductive. When a compressive force is released, the inherent resilience of the pad restores it to its normal, unstressed condition, whereupon the particles move relative to one another so that they now disengage one another rendering the pad non-conductive. The change from conductive to non-conductive and vice versa occurs rapidly, as in the case of a conventional switch of the snap action type.

According to another embodiment of the invention the pad containing the conductive particles is molded under pressure so that when the pad is in its normal, unstressed condition the conductive particles are in conductive engagement, thereby rendering that portion of the pad electrically conductive without the application of an external compressive force. The non-conductive material has a coefficient of thermal expansion which is substantially greater than that of the metal particles so that when the temperature of the pad is raised, either by current flow or by an increase in ambient temperature, the non-conductive material expands at a greater rate than that of the conductive particles so as to cause the particles to move apart and render the pad non-conductive. Upon cooling of the pad, the thermally expanded material will contact, thereby inherently returning the conductive particles into conductive engagement.

The number of particles which move into particle-to-particle engagement may vary according to the force applied to the body or to the compressive force under which it is formed, and it is not essential that all of the particles engage one another. It is only necessary that a train of particles be in engagement between the other current conductors of a circuit so as to establish a conductive path through the pad. In fact, it is preferred that not all of the particles in the body engage one another. In such a case, one train of engaged particles may be consumed by an overload current, thereby rendering the pad non-conductive. Other particles, however, will be unaffected thereby making it possible for such other particles to form additional trains for current conduction.

An advantage of devices of the kind herein disclosed is the case with which they may be varied to conform to differing operating requirements. In general, the compressive force required to render a pad conductive will be directly proportional to the thickness of the pad. A given sample of the pad, therefore, can be made responsive to extremely light pressures or responsive to relatively heavy pressures, depending on the thickness of the pad. The sensitivity of the device also is related to the quantity and size of the conductive particles. The force required to render a pad conductive varies, in general, inversely according to the quantity of particles contained within the pad and varies directly according to the size of such particles. It is possible, therefore, to manufacture devices having greatly differing operating characteristics.

The force required to render a pad conductive and the amount of travel necessary to effect compression of the pad to a state of conductivity also is related to the density of the pad. Thus, a relatively dense pad requires the application of a greater compressive force than does a less dense or foamed pad, whereas the foamed pad requires a greater compressive movement than does the more dense pad. Consequently, the force and stroke of an operating mechanism can vary within wide limits.

The material from which the device is made should be resilient at both low and high temperatures, readily moldable, stable at high temperatures, porous or non-porous, resistant to ozone, oil and arcing, inorganic, semi-inorganic, durable, low in carbon content, and have high dielectric strength. Certain kinds of polyurethanes and silicone rubbers possess all of these properties. Silicone rubbers are prepared by milling together a dimethylsilicone polymer, an inorganic filler, and a vulcanizer catalyst. Many different fillers may be used, such as titania, zinc oxide, iron oxide, silica, and the like. The type and amount of filler used alters the chemical, physical and electrical properties. It is possible, therefore, to produce many different kinds of silicone rubbers which have the properties referred to above.

Many varieties of silicone rubbers exist which perform satisfactorily. For example, good results have been obtained with silicone rubbers formed by combining resins 850 or 3120 (Dow Corning Corporation, Midland, Michigan) with the manufacture's recommended S, F or H catalyst or vulcanizer which includes as its active ingredients such compounds as dibutyl tin dilorate or stanis octoate. Satisfactory results also have been obtained with silicone rubbers formed by combining RTV-7 resin (General Electric Company, Schenectady, New York) with the manufacture's Nuocure 28 vulcanizer. Metallic particles are stirred into the resin-catalyst substances in sufficient quantity to be dispersed substantially uniformly through the mass. The mixture then is poured into a mold and cured in the manner prescribed for the particular resin. Polyurethane devices are made in the same way, but utilizing the appropriate resins and catalysts. The mold may be any desired shape to produce a composite solid or foamed body composed of the elastomeric material and the metal particles, the latter being dispersed throughout the pad, including its outer surface.

The metal particles should be formed of a metal that has excellent conductive properties and also should be one which, if it oxidizes, has an electrically conductive oxide. Particles made from noble metals such as silver and gold have the desired inherent conductivity and normally form conductive oxides, but particles composed entirely of noble metal are quite expensive. It is preferred, therefore, to use discrete, spherical metal particles composed of base metals such as copper, iron and the like, coated with silver and which are less expensive. The size of the particles may vary from 0.05 mil to 100 mils. Excellent results have been obtained utilizing particles in the 3–8 mils range. The size of the particles should vary according to the thickness of the pad, the amount of force desired to be exerted on the pad. In general, the current which can be accommodated by a pad is directly proportional to the size of the metal particles.

A typical pad may have its silicone resin and catalyst in the ratio of 10 to 1 by weight and having a particle to silicone ratio of 6 to 1. The overall pad may be of any desired area and of any desired thickness, such as 0.060 inch. It should be apparent, however, that the ratios and dimensions recited may be varied within rather wide limits depending on the particular characteristics the resulting pad are to possess. When a sample of the conductive portion of a typical pad is viewed under a microscope, the silicone rubber appears to encapsulate each metallic particle and isolate it from the others, but the rubber does not prevent relative movement of the particles. When the pad is subjected to compressive forces and deformed or compressed, the metallic particles are forced to move relatively to one another and to the encapsulating rubber in such manner that sufficient number of the particles move into engagement with one another to establish a conductive train or path through the pad. Current then may flow through the conductive body portion. The low shear resistance of silicone rubber and the nonadherence of the rubber to the particles facilitate the movement of particles. The resistance of the conductive pad when conductive corresponds substantially to the resistance of the metal particles. Since the electrical resistance of noble metals, such as silver, is quite low, the resistance of the conductive portion is also quite low and, therefore, permits the latter to accommodate a high value current. For example, a conductive pad constructed of Dow Corning 3120 silicone rubber and containing 3 mil, silver coated copper particles in the ratio referred to above and having a thickness of 0.06 inch was sandwiched between conventional terminals and was capable of conducting a current of 50 amperes without impairment. Another similar pad was incorporated in a 115-volt AC circuit including a 25-watt electric lamp bulb and was cycled at the rate of 130 cycles per minute. After more than 7 million cycles of operation, the pad still functioned perfectly.

It is believed that when a conductive path is established through the pad the current density of such path between the other circuit components is much less than that of the point-to-point contact of conventional metal-to-metal connectors. The resistance of the pad when conductive has been measured to be 0.0025 ohms which is equivalent to the resistance of 4.7 inches of 18 gauge wire or 3 inches of 20 gauge wire.

When the compressive force applied to the pad is released, the inherent resilience of the silicone rubber causes the latter to expand and assume its normal unstressed condition whereupon the engaged conductive particles are forced to move out of engagement thereby dis-establishing or breaking the conductive path. If there should be any arcing between particles as they separate from one another, the arcing will be confined to the interior of the pad. Even though the presence of an arc may destroy or impair the current conductive capacity of the particles between which the arc forms, there are so many particles in the pad and, consequently, so many possible current conductive paths, that a potential path always exists through the pad throughout its life expectancy. The presence of arcs within the pad leaves a track, but because of the low carbon content of the silicone rubber the arcing track is composed of nonconductive inorganic matter, rather than a conductive carbon track such as would be left in organic materials.

It should now be obvious to one skilled in the art that the diode 1 is easily and inexpensively manufactured with a number of easy steps. First, the PN junction sandwiched between the two resilient pads 7 and 8 is placed on the base member and aligned properly in the center. Secondly, the cap 3 with contact member 9 is fixed in its proper position on the base member. Thirdly, a downward force as shown by the arrow in FIG. 1 is exerted on the contact member 9 so as to compress pads 7 and 8. Lastly, the cement 11 is applied while the downward force is being exerted and allowed to set.

In an alternate method for assembling the diode 1, the contact 9 may be fixed to the cap first. The PN junction could be sandwiched between the resilient pads 7 and 8 and placed on the case 2. Then the cap with the contact 9 in place is brought into contact and fixed to the case 2 in a suitable manner.

Figure 3:
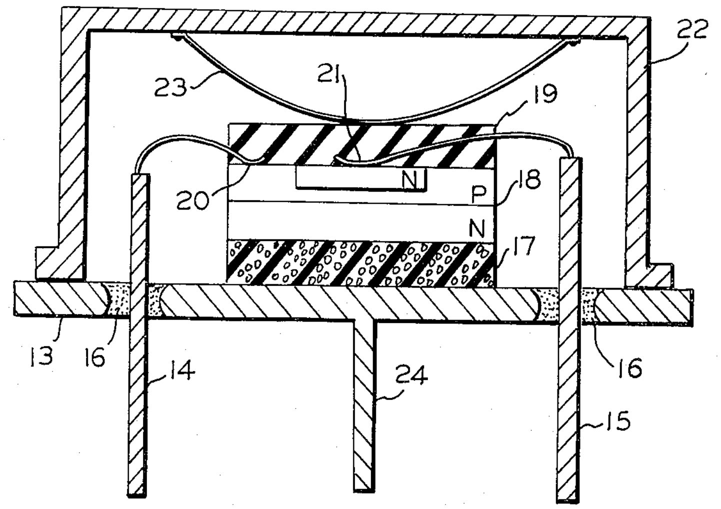
FIG. 3 is side view in cross section of another embodiment of this invention.

In the embodiment shown in FIG. 3 a method of making connections to an NPN transistor chip is shown. A conventional transistor housing is shown having a case 13 made of a conductive metal. Extending through the case 13 is a base lead 14 and an emitter lead 15. Both base lead 14 and emitter lead 15 are insulated from the case 13 and are held in place by a suitable insulating cement 16. Disposed between the transistor chip 18 and case 13 is a resilient pad 17 similar to pads 7 and 8 in FIG. 1. Conventional wire bonds 20 and 21 are made to the base and the emitter of the transistor chip and are connected to base lead 14 and emitter lead 15. Insulator 19 is placed over the transistor chip 18 and has grooves in which wires 20 and 21 fit. Cap 22 encloses the assembly and is fixed to the case 13. Spring 23 provides pressure to compress the pad 17. Connection to the collector is made to the case 13 by collector lead 24.

It is not necessary that the transistor case be of the type shown in FIG. 3. For example, the case might be the type having a threaded stud for heatsinking purposes. If this should be the type used, then electrical and thermal contact is made to the collector of the transistor chip by the resilient elastomeric conductive pad.

It is also possible to assemble other semiconductor devices according to this method. This method can be used in semiconductor devices where at least one contact area of the chip is large enough to make contact to the resilient elastomeric conductive pad. SCR's, Triac's and other semiconductors can be assembled by this method. In general, any semiconductor device having N terminals can be assembled according to this invention as long as at least 1 of the N contact areas on the chip is large enough to make contact to.

It should be obvious to one skilled in the art that numerous modifications can be made without departing from the true spirit of the invention which is defined in the claims.

What is claimed is:

1. A method of making a semiconductor device having a PN semiconductor chip, a case member, and a cap assembly, comprising the steps of:

placing said PN semiconductor chip between first and second preformed, resilient, elastomeric, compressible pads of substantially uniform thickness throughout, said pads having a plurality of electrically and thermally conductive particles dispersed therethrough, said particles engaging one another to establish electrically and thermally conductive paths through said pads to render them electrically and thermally conductive;

positioning said first pad in abutting unbonded contact with said case member;

positioning said cap assembly in abutting unbonded contact with said second pad;

moving said cap assembly and said case member toward each other to compress said pads;

securing said cap assembly to said case member while maintaining said pads in compression.

2. A method of making a transistor assembly having a semiconductor chip with emitter, collector and base contact areas, a case member through which contact is made to the emitter and base contact areas of the semiconductor chip and to which said collector contact area is electrically and thermally connected, and a cap attached to said case member to enclose said semiconductor chip, comprising the steps of:

positioning a preformed resilient elastomeric compressible pad of substantially uniform thickness throughout in abutting unbonded contact with said case member and said collector contact area to electrically and thermally connect said case member with said collector contact area, said pad containing a plurality of electrically and thermally conductive particles dispersed therethrough, said particles engaging one another to establish electrically and thermally conductive paths through said pad to render it electrically and thermally conductive;

Compressing said pad to maintain electrical and thermal contact between said collector contact area and said case member;

making electrical connections to said emitter and base contact areas; and attaching said cap member to said case member to enclose said semiconductor chip.

3. A method of making a semiconductor assembly having a semiconductor chip with a plurality of contact areas, a case member to which one of said contact areas is electrically and thermally connected, means for making electrical connections to the remainder of said contact areas, and a cap attached to said case member to enclose said semiconductor chip, comprising the steps of:

positioning a preformed resilient elastomeric compressible pad of substantially uniform thickness throughout in abutting unbonded contact with said case member and said one of said contact areas to electrically and thermally connect said case member with said one of said contact areas, said pad containing a plurality of electrically and thermally conductive particles dispersed therethrough, said particles engaging one another to establish electrically and thermally conductive paths through said pad to render it electrically and thermally conductive;

compressing said pad to maintain electrical and thermal contact between said one of said contact areas and said case member;

making electrical connections to the remainder of said contact areas; and attaching said cap member to said case member to enclose said semiconductor chip.

4. The method as defined in claim 3 wherein said pad is normally electrically and thermally non-conductive and is rendered electrically and thermally conductive in response to compression thereof.

* * * * *